United States Patent [19]
Hoon

[11] Patent Number: 5,189,783
[45] Date of Patent: Mar. 2, 1993

[54] PARTS MOUNTING APPARATUS FOR MEMORY BOARD

[76] Inventor: Jung C. Hoon, 7-1107 Shindonga Apt., 988-1, Pnagbae Dong, Socho Ku, Seoul, Rep. of Korea

[21] Appl. No.: 655,660

[22] Filed: Feb. 14, 1991

[30] Foreign Application Priority Data

Nov. 7, 1990 [KR] Rep. of Korea .................. 90-17997

[51] Int. Cl.⁵ ............................................. B23P 19/00
[52] U.S. Cl. ....................................... 29/741; 29/743; 294/64.1
[58] Field of Search ........................ 29/740, 741, 743; 294/64.1

[56] References Cited

U.S. PATENT DOCUMENTS 5,033,783 7/1991 Izumi et al. .......................... 29/743
5,105,532 4/1992 Fritsch ................................... 29/743

*Primary Examiner*—P. W. Echols
*Attorney, Agent, or Firm*—Lahive and Cockfield

[57] ABSTRACT

A parts mounting apparatus comprises a front panel which includes a plurality of switches for selecting one required operating mode among manual, semi-automatic and automatic operations, and related lamps therewith for indicating the relevant function, the front panel being disposed in front of a main body, a foot switch connected to the body through an electric cord of a predetermined length, a work table on which a jig for parts and a jig for memory boards are disposed, and which is guided along guide bars which extend between two parallel support members, the members being disposed at both sides on the upper surface of the main body at a front portion thereof, both ends of the guide bar being fixed at the support member and stops being attached at the guide bar at predetermined positions respectively, and a part carrier being disposed on the upper surface at a rear portion thereof, including a fixed plate which is fixedly mounted on the upper surface of the main body, a support plate which is spaced apart from the fixed plate through four support rods which are located between the fixed plate and the support plate, upper and lower stops which are spaced apart at each support rod at a predetermined distance, and a movable plate which vertically moves along the four support rods between the upper and lowers tops and to which an adjustable bracket is adjustably attached by a plurality of bolts.

7 Claims, 6 Drawing Sheets

PARTS MOUNTING APPARATUS FOR MEMORY BOARD

BACKGROUND OF THE INVENTION

The present invention relates to a mounting apparatus for memory devices, more particularly to a parts mounting apparatus for a memory board, by which a plurality of uniformly sized Dynamic Random Access Memory (DRAM) devices can be collectively attached on a patterned memory board or be conveyed to the board one at a time, and thus a reduced number of production processes and a decreased time of production can be achieved.

Automated devices for mass-production have been developed to realize various kinds of factory automation. When such automated devices are installed on the production lines of mechanical and electric products, the number of operators are inevitably reduced, and production processes are able to be repeatedly performed with reduced error rates. For example, the circuit boards which are used in computers, electronic products and the like are arranged at a predetermined location in an apparatus and passive and active devices for performing various functions are mounted on them. The boards vary according to their uses and various automated devices have been developed to accurately and rapidly fix devices on the boards.

When a number of different devices are intended to be mounted and fixed in a complicated pattern on such boards, the usage of high-priced automated devices may be efficient. However, for memory devices mounted on the main board of personal computers, that are numerous and uniform in size, an automated device, by which such memory devices can be accurately and rapidly conveyed to a board to be mounted thereon, and that is not complicated and expensive, is desirable.

SUMMARY OF INVENTION

The present invention has as its object providing a parts mounting apparatus for memory boards, by which a plurality of uniform sized memory devices can be collectively attached to the board or can be conveyed to the board one at a time, thus reducing the number of production processes and the time of production. Hydraulic cylinders are used to laterally move a work table and to vertically move a device, or part, carrier, whether or not the operation of the apparatus is manual, semi-automatic or automatic, and therefore an accurate and rapid operation of mounting and fixing the devices onto a board is economically performed.

Preferably, a parts mounting apparatus according to the invention is characterized in that the apparatus comprises: a front panel with a plurality of switches for selecting one required operating mode among manual, semi-automatic and automatic operations, and related lamps therewith for indicating the relevant functions, a foot switch connected to the apparatus to operate it, and a work table on which a jig for parts and a jig for memory boards is disposed. The work table is guided along guide bars which extend between support members disposed on the upper surface of a main body, the ends of the guide bars being fixed in the support members, and stops being mounted on the guide bars at predetermined positions. A part carrier is disposed on the upper surface of the main body at a rear portion thereof, and includes a fixed plate mounted on the upper surface, a support plate which is spaced apart from the fixed plate by four support rods which are located between the fixed plate and the support plate, upper and lower stops which are mounted on each support rod and spaced apart at predetermined distances along the support rod, and a movable plate which moves vertically along the support rods between the upper and lower stops, and to which an adjustable bracket is fixedly attached by a plurality of bolts.

The above and other objects, features and advantages of the invention will become apparent from the following description, taken in conjunction with the accompanying drawings, which show by way of example one preferred embodiment of the invention.

DESCRIPTION OF PREFERRED EMBODIMENT

Figure 1:
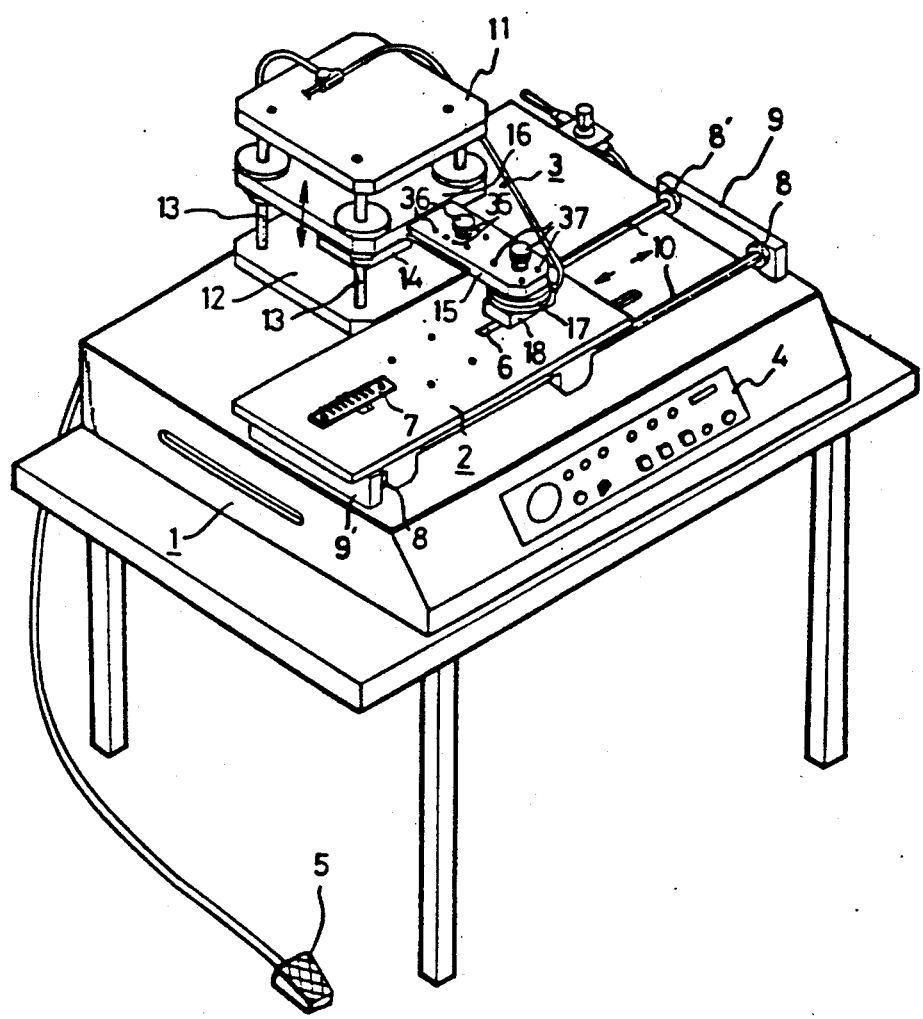
FIG. 1 is a schematic perspective view of a parts mounting apparatus for memory boards representing one embodiment of the invention.

Hereafter, the invention is described more particularly by way of the embodiment shown in the drawings.

FIG. 1 is a perspective view of the parts mounting apparatus according to an embodiment of the invention. The apparatus includes a work table 2 and a part carrier 3 which are operated by hydraulic cylinders in manual, semi-automatic or automatic mode according to switches on a front panel 4 disposed at the front face of the main body 1 of the apparatus. A plurality Of memory devices, or chips, on a jig 6 which is located on the work table 2 may be accurately and rapidly conveyed to a memory board on another jig 7 one at a time, and then mounted thereon by operating the work table 2 and part carrier 3.

The work table 2 is located on the upper surface of the front portion of the main body 1. The work table 2 is guided along guide bars 10 which extend between two parallel support members 9,9' disposed at either side of the upper surface of said main body 1 at the front portion thereof. The ends of each guide bar 10 are fixed in the support members 9,9', and a pair of stops 8,8' are also mounted on each guide bar 10. The part carrier 3 is disposed on the upper surface at a rear portion thereof, and includes a fixed plate 12, a support plate 11 and a movable plate 16. The support plate 11 is spaced apart from the fixed plate 12 by four support rods 13 which are located therebetween. A pair of upper and lower stops 14 are disposed on each rod, being spaced apart at a predetermined distance. The movable plate 16 is movable along the four support rods between the upper and lower stops 14, and an adjustable bracket 15 which is fixed to the movable plate 16 is movable vertically also. With the usage of a foot switch 5 which is electrically connected by cable, the movable plate 16 may be operated to move between the support plate 11 and the fixed plate on the support rods 13 and thus the adjustable bracket 15 can be moved also between the stops 14.

Figure 2:
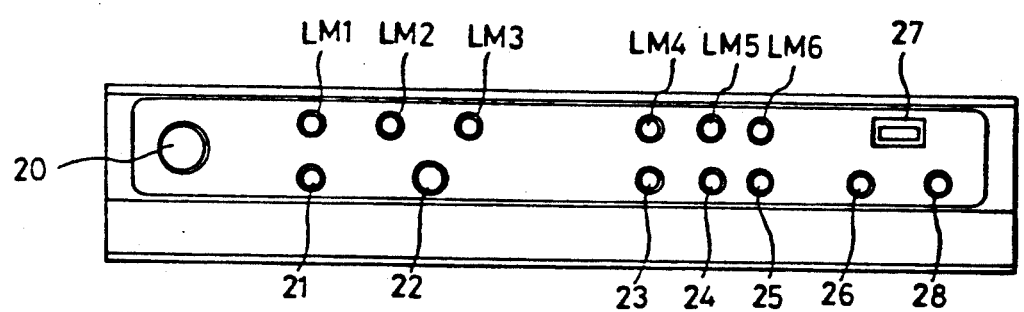
FIG. 2 shows a front panel of FIG. 1 in detail.

FIG. 2 shows the front panel 4 of FIG. 1 in detail, the switches on which may be manipulated to operate the hydraulic cylinders disposed on the upper surface of the main body 1 shown in FIG. 1, thereby operating the lateral movement of the work table 2 and the vertical movement of the part carrier 3 sequentially. The front panel 4 includes a pressure gauge 20 for indicating the pressure of the working medium used to operate the hydraulic cylinders or the like, a key switch 21 for putting the apparatus in an operative condition and its corresponding lamp LM1, a selection switch 22 for selecting the operation mode of the work table 2 and the part carrier 3 among manual, semi-automatic or automatic modes and its corresponding lamps LM2–LM3, push switches 23–25 for turning ON or OFF the lateral movement of the work table 2 and the vertical movement of the part carrier 3 and their corresponding lamps LM4–LM6, a start switch 26 and stop switch for use when the selection switch 22 is in its automatic mode position, and a counter 27 for indicating the number of operations per process for the work table 2 and the part carrier 3.

Figure 3:
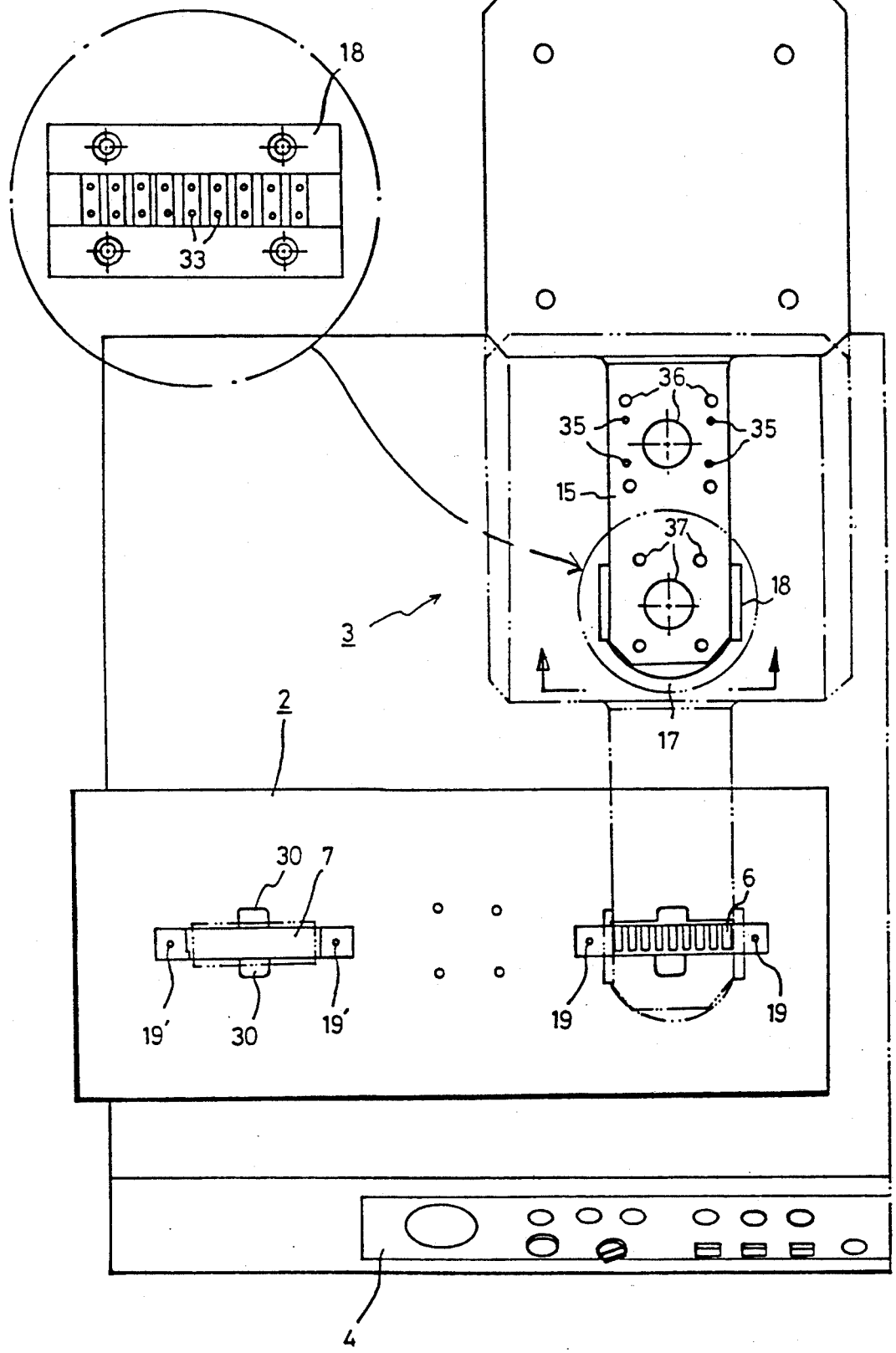
FIG. 3 is a schematic partial plan view of the apparatus, which shows essential parts of the upper portion thereof.

FIG. 3 is a partial plan view of the apparatus, which shows the essential parts of the upper portion thereof. In the operation of the apparatus, the lateral movement of the work table 2 between the support members 9,9' and the vertical movement of the movable plate 16 and thus the part carrier 3 between the support plate 11 and the fixed plate 12 are sequentially performed by operating the switches on the front panel 4 of the main body 1. In addition, the operation may be performed in manual, semi-automatic, or automatic mode by use of the switches 22–23 and the foot-switch 5.

The jig 6 for parts and the jig 7 for memory boards are arranged at either side of the work table 2, and an air holder 18, for holding by suction a plurality of memory parts, together with circular discs 17 are fixed at one end of the adjustable bracket 15 of the movable plate 16. The jig 6 for parts is selected to be suitable for the size of the memory parts to be mounted on the patterned memory boards. The jig 6 may be exactly located at the right side of the work table 2 by adjusting a screw 19. The operator lays the memory parts on the jig 6. The jig 7 for memory boards is installed at the left side of the work table 2 so that a plurality of memory parts conveyed at a time are exactly mounted and fixed on the memory boards. The jig 7 has a groove 30 and a screw 19' to provide for mounting or demounting of the memory boards by the operator.

Figure 4:
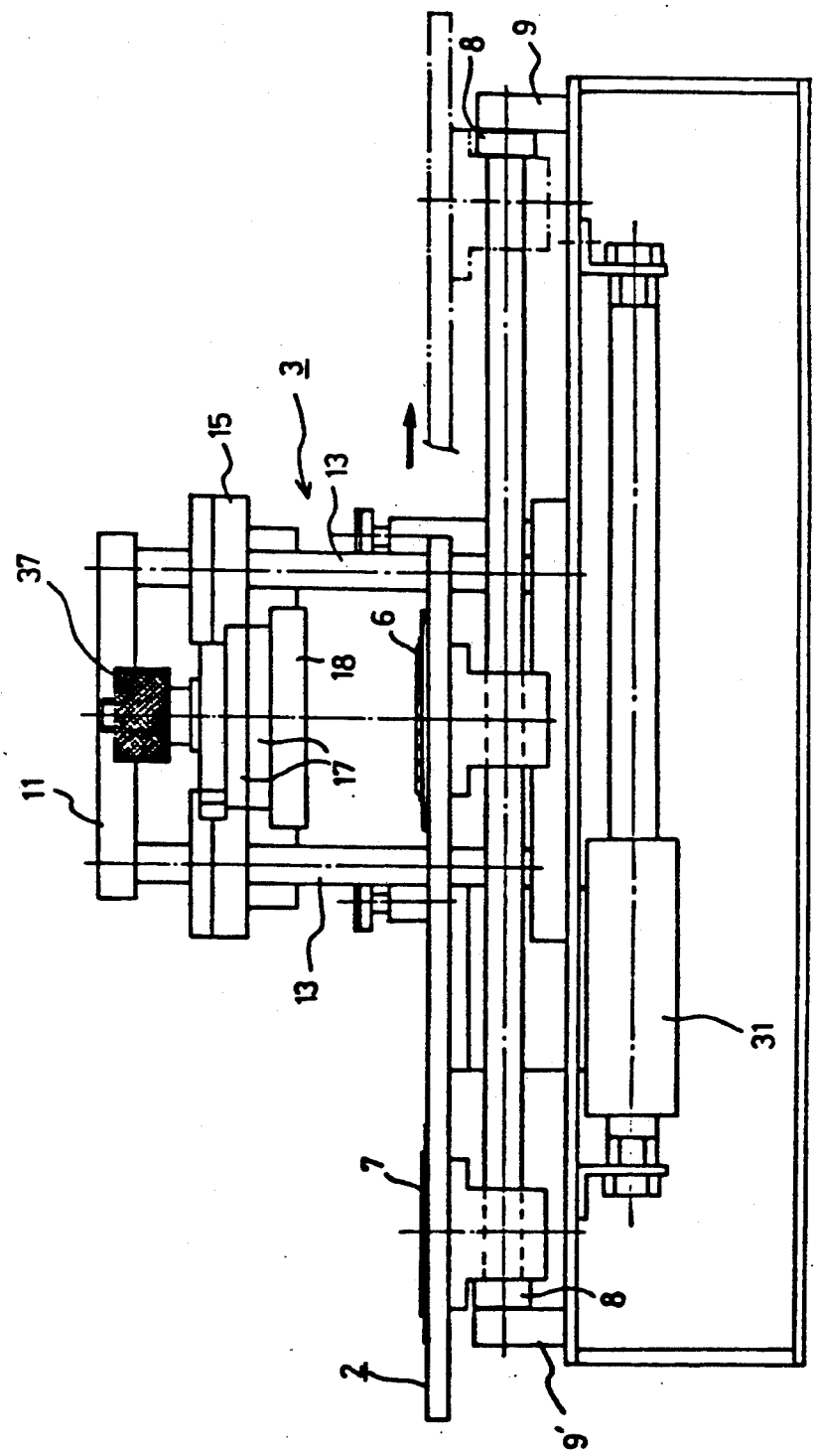
FIG. 4 is a laterally sectioned front view of the apparatus, which shows essential interior parts thereof.

During this lateral movement of the work table 2, the manual operation of the operator is also involved. The work table 2 is moved left and right so that jig 6 and jig 7 can be placed under the parts carrier 3 according to the movement of the hydraulic cylinder 31 disposed in the apparatus as shown in FIG. 4, by the manipulation of the switch on the front panel 4. Since the guide bars 10 extend between the support members 9,9' disposed at either side of the upper surface of the main body, and the stops 8,8' are mounted on the guide bars 10 at predetermined positions, the lateral movement of the work table 2 is guided along the guide bars 10, and may perform repeatedly the intermittent stop-and-movement between the stops 8,8' with accuracy and rapidity.

Figure 5:
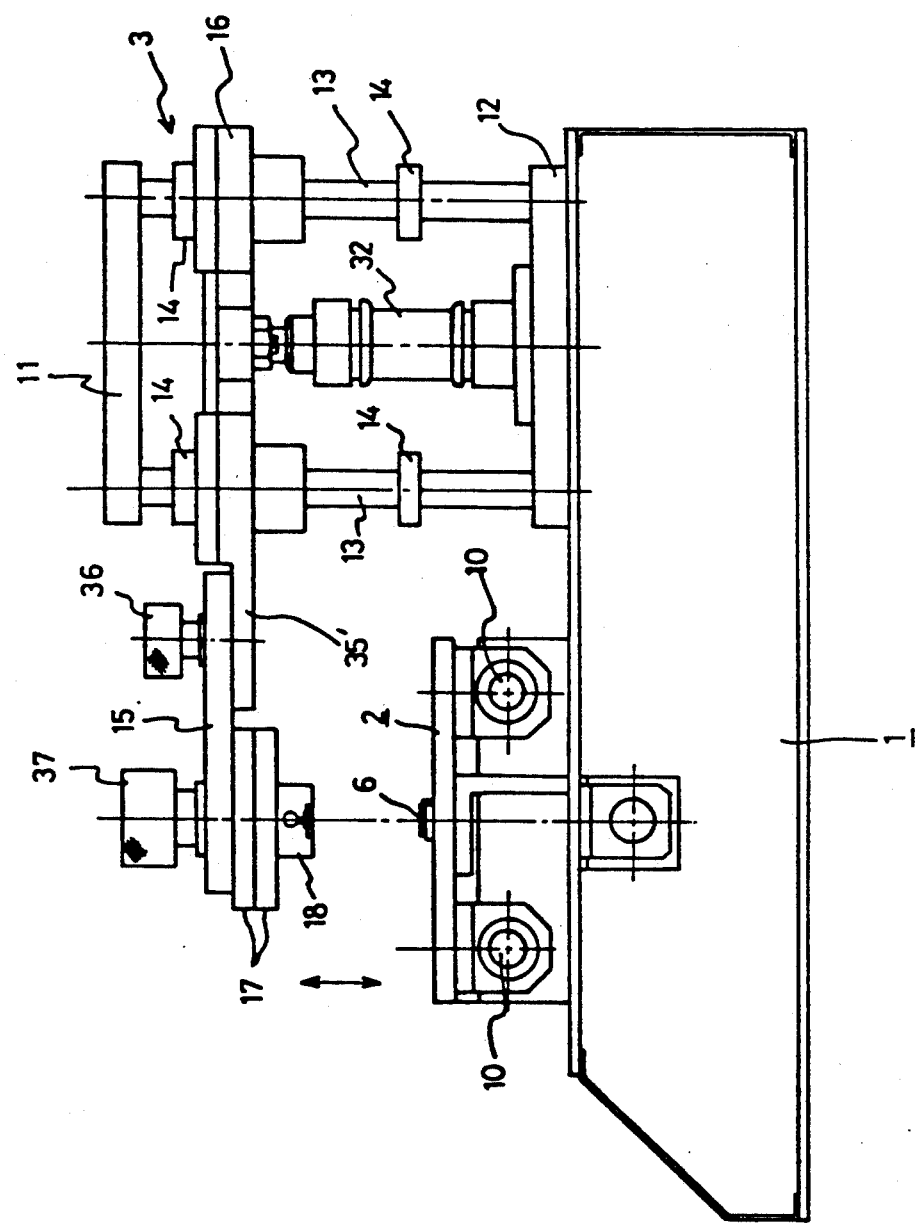
FIG. 5 is a schematic side view of the apparatus.

The part carrier 3 is disposed on the upper surface at a rear portion of the main body 1 as shown in FIG. 5. The fixed plate 12 is fixed on the upper surface of the main body 1 and four support rods 13 are disposed at four corners of the fixed plate 12. The support plate 11 is spaced apart from the fixed plate 12 by the four support rods 13 which are located therebetween. On each support rod 13, a pair of upper and lower stops 14 are located and spaced apart at a predetermined distance. The four support rods 13 maintain the support relationship between the fixed plate 12 and the support plate 11, but the movable plate 16 can also be vertically moved along the four support rods 13 between the upper and lower stops 14. A hydraulic cylinder 32 arranged at the center of the fixed plate permits the movable plate 16 to move vertically between the lower and upper stops 14.

Figure 6:
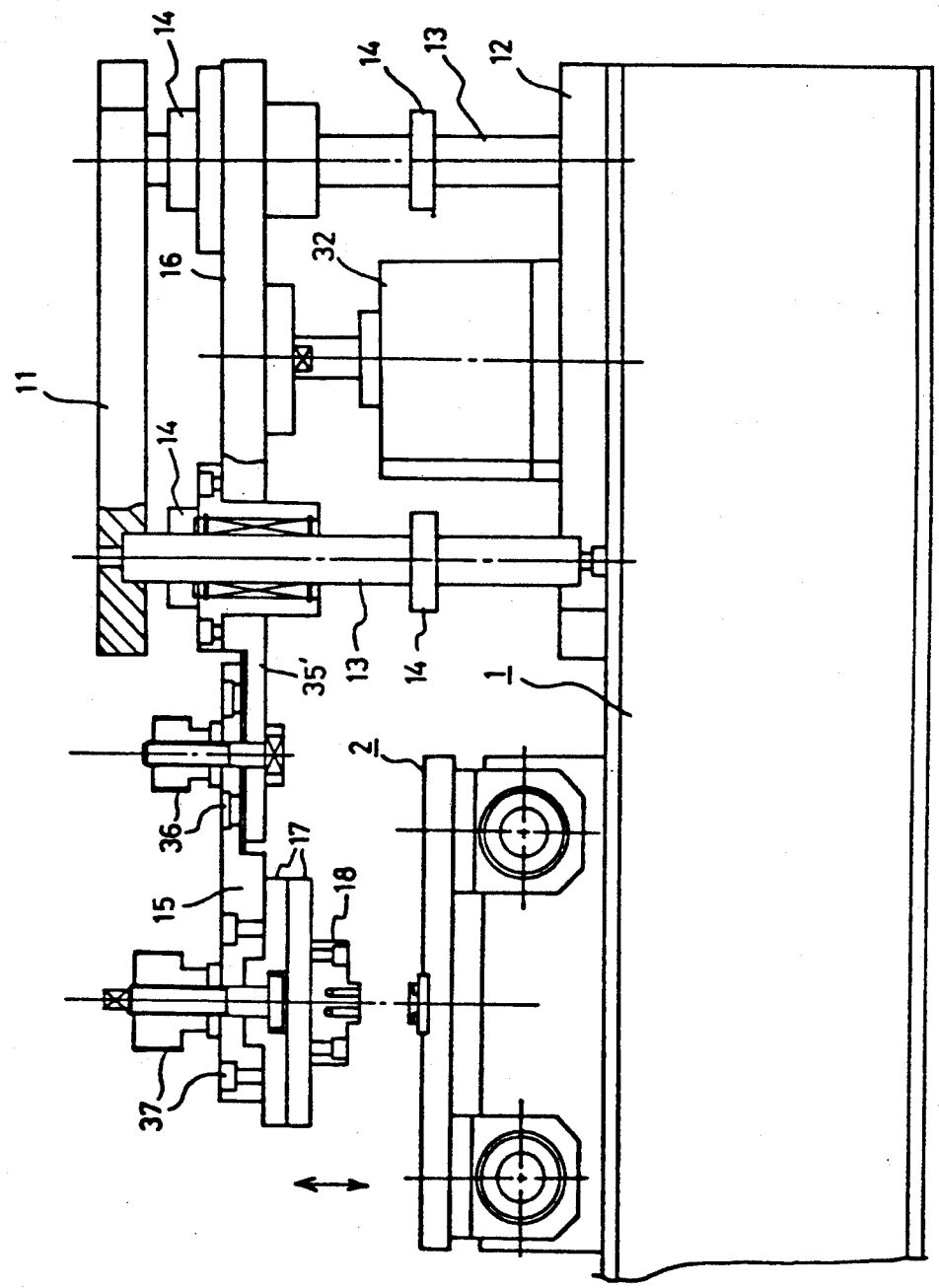
FIG. 6 is an enlarged side view of FIG. 5, in which some essential parts thereof are shown partially cut away.

The movable plate 16 which is vertically movable by the movement of the hydraulic cylinder 32 can therefore mount a plurality of parts onto the memory board on the board jig 7 precisely, by picking parts on the parts jig 6 by the air holder 18, then moving between the forementioned jigs 6,7 of the work table 2. The air holder 18 of the part carrier 3 has as many holes 33 as the arrangement of the memory parts on the parts jig 6 so as to pick up the memory parts exactly in response to the hydraulic pressure of the working medium supplied from a hydraulic hose at both sides. As shown in FIG. 6, the adjustable bracket 15 is fixedly attached to a plate 35' protruding from the movable plate 16, by a plurality of bolts 36, and can be precisely adjusted vertically by four eccentricity adjusting tap screws 35, and precisely adjusted laterally by means of two juxtaposed circular discs 17, through which the air holder 18 is attached thereto by a plurality of bolts 37.

Therefore, as described above, with vertical movement of the movable plate 16 caused by the hydraulic cylinder 32, the plurality of memory parts on the jig 6 are precisely picked up by the air holder 18 attached to the bracket 15 attached to the movable plate 16, and then conveyed to the memory board on the other jig 7, and finally mounted and fixed thereon. The four eccentricity adjusting tap screws 35 allow the adjustable bracket 15 to be more precisely adjusted in the vertical direction, with the bracket 15 being threadedly attached to the protruding plate 35' by means of bolts 36.

The air holder 18 can be more precisely adjusted in the lateral direction with the intermediate of the two juxtaposed circular discs 17 at the front portion of the adjustable bracket 15.

As is clear from the foregoing description, this parts mounting apparatus for memory boards provides a means by which a plurality of uniformly sized Dynamic Random Access Memory parts can be collectively attached on a patterned memory board or can be conveyed to the same board one at a time, and thus a reduced number of production processes and a decreased time of production can be achieved. Hydraulic cylinders are used to laterally move the work table and to vertically move the part carrier regardless of the selection of the operation modes from among manual, semi-automatic and automatic modes, and therefore accurate and rapid operations for mounting and fixing the parts onto a board are economically performed.

The invention has been described in great detail sufficient to enable one of ordinary skill in the art to make and use the same. Obviously, modifications and alterations of the preferred embodiment will occur to others upon a reading and understanding of the specification and it is our intention to include all such modifications and alterations as part of our invention insofar as they come within the scope of the appended claims.

What is claimed is:

1. A parts mounting apparatus for mounting parts on a circuit board, comprising:
   a main body with an upper surface,
   support members spaced apart and disposed on said upper surface,
   guide bars extending between said support members,
   a work table adapted for sliding movement on said guide bars,
   a parts jig and a board jig spaced apart and disposed on said work table, and
   a parts carrier located on said upper surface, comprising
   a vertically movable plate, and
   a bracket adjustably attached to said movable plate.

2. A parts mounting apparatus as claimed in claim 1 wherein said parts carrier further includes
   a fixed plate fixed to said upper surface,
   a support plate above and spaced apart from said fixed plate, and
   a plurality of support rods extending from said fixed plate to said support plate,
   said vertically movable plate adapted for sliding movement on said support rods.

3. A parts mounting apparatus as claimed in claim 2 further including:
   a first hydraulic means for moving said work table on said guide bars, and
   a second hydraulic means for moving said vertically movable plate on said support rods.

4. A parts mounting apparatus as claimed in claim 3 further including
   a first switch means operatively connected to said first hydraulic means for operating it and
   a second switch means operatively connected to said second hydraulic means for operating it,
   said first and second switch means being arranged for sequential operation of said first and second hydraulic means.

5. A parts mounting apparatus as claimed in claim 2 further including:
   a first pair of spaced apart stops on said guide bars to limit the travel of said work table, and
   a second pair of spaced apart stops on said support rods to limit the travel of said vertically movable plate.

6. A parts mounting apparatus as claimed in claim 2 further including
   a foot switch means operatively electrically connected to said vertically movable plate for controlling the operation of said plate.

7. A parts mounting apparatus as claimed in claim 1 wherein
   said bracket is vertically adjustably attached to said movable plate by a plurality of eccentricity adjusting tap screws, and further including
   two juxtaposed circular discs laterally adjustably attached to said bracket and a parts air holder attached to said juxtaposed circular discs.

* * * * *